United States Patent
Knollenberg et al.

(10) Patent No.: US 7,528,681 B2
(45) Date of Patent: May 5, 2009

(54) ACOUSTIC DEVICES USING AN ALGAN PIEZOELECTRIC REGION

(75) Inventors: Clifford F. Knollenberg, Mountain View, CA (US); Michael Kneissl, Berlin (DE); Noble M. Johnson, Menlo Park, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 191 days.

(21) Appl. No.: 11/312,035

(22) Filed: Dec. 20, 2005

(65) Prior Publication Data
US 2007/0139141 A1   Jun. 21, 2007

(51) Int. Cl.
*H03H 9/25*   (2006.01)
*H03H 3/02*   (2006.01)
*H03H 9/54*   (2006.01)

(52) U.S. Cl. .................. 333/187; 310/322; 257/416; 29/25.35; 438/48

(58) Field of Classification Search .............. 333/189, 333/187, 188; 438/48, 50–53, 455–459, 438/479, 483, 718; 257/414–419; 427/100; 216/2, 41; 29/25.35, 846; 310/321, 322, 310/324
See application file for complete search history.

(56) References Cited

U.S. PATENT DOCUMENTS

| | | | |
|---|---|---|---|
| 5,587,620 A | 12/1996 | Ruby et al. | |
| 6,060,818 A | 5/2000 | Ruby et al. | |
| 6,071,795 A | 6/2000 | Cheung et al. | |
| 6,335,263 B1 | 1/2002 | Cheung et al. | |
| 6,365,429 B1 | 4/2002 | Kneissl et al. | |
| 6,420,242 B1 | 7/2002 | Cheung et al. | |
| 6,448,102 B1 | 9/2002 | Kneissl et al. | |
| 6,562,648 B1 | 5/2003 | Wong et al. | |
| 6,617,261 B2 | 9/2003 | Wong et al. | |
| 6,627,921 B2 | 9/2003 | Wong et al. | |
| 6,662,419 B2 * | 12/2003 | Wang et al. | 29/25.35 |
| 6,710,681 B2 | 3/2004 | Figueredo et al. | |
| 6,714,102 B2 | 3/2004 | Ruby et al. | |
| 6,757,314 B2 | 6/2004 | Kneissl et al. | |
| 6,816,035 B2 | 11/2004 | Ma et al. | |
| 6,822,535 B2 | 11/2004 | Ma et al. | |
| 6,895,645 B2 | 5/2005 | Xu et al. | |
| 2002/0094002 A1 * | 7/2002 | Amano et al. | 372/45 |
| 2002/0118078 A1 * | 8/2002 | Whatmore et al. | 333/189 |

(Continued)

FOREIGN PATENT DOCUMENTS

JP       2001044794 A   *   2/2001

OTHER PUBLICATIONS

Larson, John D. III, et al., "PZT Material Properties at UHF and Microwave Frequencies Derived from FBAR Measurements"; *IEEE Ultrasonics Symposium*, 2004, 5 pgs.

(Continued)

*Primary Examiner*—Barbara Summons
(74) *Attorney, Agent, or Firm*—Fay Sharpe LLP (57) ABSTRACT

Provided is a method of forming an acoustic based device, including forming an AlGaN region having a first surface and a second surface. A first electrode is deposited on the first surface of the AlGaN region, and then a second electrode is deposited on a second surface of the AlGaN-region.

In another aspect of the present application, the AlGaN region is formed by an epitaxial layer overgrowth process.

8 Claims, 5 Drawing Sheets

U.S. PATENT DOCUMENTS

| | | | |
|---|---|---|---|
| 2003/0112097 A1* | 6/2003 | Ma et al. | 333/187 |
| 2003/0222263 A1* | 12/2003 | Choi | 257/79 |
| 2004/0135144 A1* | 7/2004 | Yamada et al. | 257/59 |
| 2005/0099245 A1* | 5/2005 | Nakatsuka et al. | 333/133 |
| 2006/0038636 A1* | 2/2006 | Tsurumi et al. | 333/191 |

OTHER PUBLICATIONS

Davis, R.F., et al., Abstract: "Conventional and Pendo-Epitaxial Growth of GaN(0001) Thin Films on Si(111) Substrates"; *Journal of Crystal Growth*; Oct. 2001, pp. 335-341, vol. 231; Netherlands.

Efimov, A.N., et al., Abstract: "On the Epitaxy of Aluminum Nitride on Silicon Substrates in a Chloride-Hydride Process"; *Pis'ma v Zhurnal Tekhnicheskoi Fizika*, Oct. 1998, pp. 52-57, vol. 24, No. 19-20; Russia.

Cleland, A.N., et al.; Abstract: "Single-Crystal Aluminum Nitride Nanomechanical Resonators"; *Applied Physics Letters*, Sep. 24, 2001, pp. 2070-2072, vol. 79, No. 13; USA.

Heikman, Sten, et al.; "Epitaxial Lateral Overgrowth of High Al Composition AlGaN Alloys on Deep Grooved SiC Substrates"; *Japanese Journal of Applied Physics*, 2005, pp. L405-L407, vol. 44, No. 13.

Chen, Changqing, et al.; "A New Selective Area Lateral Epitaxy Approach for Depositing a-Plane GaN over r-Plane Sapphire"; *Japanese Journal of Applied Physics*, Jul. 15, 2003, pp. L818-L820, vol. 42, Part 2, No. 7B.

Chen, Changqing, et al.; "Lateral Epitaxial Overgrowth of Fully Coalesced *A*-Plane GaN over *R*-Plane Sapphire"; *Japanese Journal of Applied Physics*, Jun. 15, 2003, pp. L640-L642, vol. 42, Part 2, No. 6B.

Zytkiewicz, Z.R., et al.; Recent Progress in Lateral Overgrowth of Semiconductor Structures from the Liquid Phase, *Cryst. Res. Technol.*, 2005, pp. 321-328, vol. 40, No. 4/5; Verlag GmbH & Co. KGaA, Weinheim.

Tsubouchi, Kazuo, et al.; "Zero-Temperature-Coefficient SAW Devices on AIN Epitaxial Films"; *IEEE Transactions on Sonics and Ultrasonics*, Sep. 1985, pp. 634-643, vol. SU-32, No. 5.

Ruby, Richard, Director of Technology, Agilent TechnologiesIng.; "FBAR—From Technology Development to Production"; 2004, 5 pgs.

Ruby, Richard, "Ultra-Miniature High-Q Filters and Duplexers Using FBAR Technology"; *IEEE International Solid-State Circuits Conference*, 2001, pp. 120-121, Session 7/Technology Directions: Advanced Technologies/7.5.

* cited by examiner

ACOUSTIC DEVICES USING AN ALGAN PIEZOELECTRIC REGION

BACKGROUND

The present application is directed to acoustic-based devices, and more particularly, to acoustic resonators formed as Thin Film Bulk Acoustic Resonators (FBARs). It is to be appreciated, however, the following concepts may be implemented in other acoustic based devices.

FBARs are gaining increased use in handheld communication devices and are posed to replace larger bulk ceramic RF filters which are designed on the centimeter (cm) scale, as compared to FBARs, which are in the micrometer (μm) size range.

In particular, as handheld communication devices, such as cell phones, personal digital assistants, beepers, global positioning devices, hand-held digital music and/or video players, among others, become smaller, and include additional functionality, it becomes important to reduce the cost and size of the electronic components. This has led to a continuing need for smaller signal control elements such as the FBARs.

Figure 1:
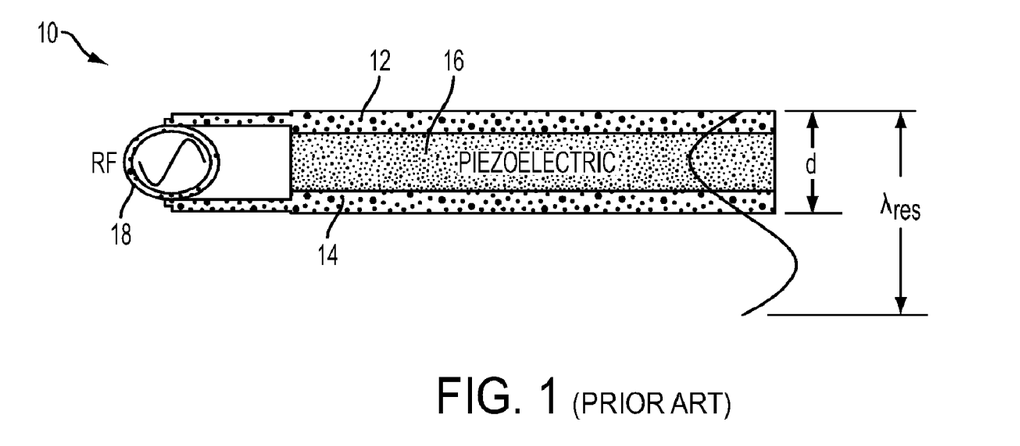
FIG. 1 is a simplified cross-section of a bulk acoustic resonator (FBAR)

As shown in FIG. 1, in its simplest form, an FBAR 10 includes bottom and top electrodes 12, 14 separated by a piezoelectric (PZ) 16. The electrodes 12, 14 are energized by power source 18, such as an RF power supply.

FBAR 10 is supported (not shown) at its outer perimeter to permit movement of the piezoelectric. When FBAR 10 is energized by power source 18, an electric field is created between electrodes 12, 14, and piezoelectric 16 converts some of the electrical energy into mechanical energy in the form of mechanical waves. The waves propagate in the same direction as the electric field, and reflect off the electrode/air interface.

A resonant mode exists when the thickness of FBAR 10 is equivalent to an integer multiple of one-half of the acoustic wavelength. More particularly:

$$d = n\frac{\lambda_{res}}{2},$$

where n=an integer, $\lambda_{res}$=resonant wavelength, and d=stack thickness. When in the resonant mode, FBAR 10 can be employed as an electronic resonator.

Presently, a common procedure for manufacturing FBARs is through the use of deposition and micro-forming techniques employed for the fabrication of integrated circuits. More particularly, piezoelectric 16 may be formed by sputtering a material, such as aluminum nitride (AlN), which is commonly formed as a polycrystalline material, and which is a preferred material for existing FBAR production. Examples of FBARs using polycrystalline on a silicon substrate are disclosed in U.S. Pat. No. 5,587,620, issued Dec. 24, 1996, entitled "Tunable Thin Film Acoustic Resonators and Method for Making the Same," by Ruby et al.; U.S. Pat. No. 6,060,818, issued May 9, 2000, entitled "SBAR Structures and Method of Fabrication of SBAR.FBAR Film Processing Techniques for the Manufacturing of SBAR/BAR Filters," by Ruby et al.; and U.S. Pat. No. 6,710,681 B2, Issued Mar. 23, 2004, entitled "Thin Film Bulk Acoustic Resonator (FBAR) and Inductor on a Monolithic Substrate and Method of Fabricating the Same," by Figueredo et al.

The described materials and the processes used to manufacture FBARs, are based on materials and techniques well known in the art for fabricating integrated circuits. The focus of existing FBAR manufacturing, which relies on processes and materials known to those working in the integrated circuit arena, has limited the search for other materials and/or processes which may be used to develop more efficient acoustic devices, including FBARs.

BRIEF DESCRIPTION

Provided is a method of forming an acoustic based device, including forming an AlGaN region having a first surface and a second surface. A first electrode is deposited on the first surface of the AlGaN region, and then a second electrode is deposited on a second surface of the AlGaN region.

In another aspect of the present application, the AlGaN region is formed by an epitaxial layer overgrowth process.

DETAILED DESCRIPTION

As mentioned, FIG. 1 illustrates a simplified view of FBAR 10 incorporating electrodes 10, 12 attached to piezoelectric 16, wherein the device is driven by an RF supply 18.

Such a device may be made using existing FBAR manufacturing processes which focus on using techniques and materials commonly employed in the field of integrated device manufacturing. However, in unrelated fields such as ultraviolet (UV) LED and laser development, other materials and processes have been developed which are considered by the inventors to be beneficial for the implementation of FBARs, as well as other acoustic devices. Using materials and techniques to be described below, resonators for applications in the GHz range may be constructed with physical dimensions less than 100 microns in diameter or across and a few microns (e.g., 1 μm-10 μm) in thickness.

For example, single crystal AlGaN layers have been successfully grown for use in the development of UV LEDs/lasers. The inventors have discovered and the present application discloses, the growth and use of AlGaN layers in acoustic applications such as, among other uses, acoustic resonators known as FBARs. In particular, it has been determined that certain benefits will be obtained by use of single crystal AlGaN materials, and therefore the following discussion will describe use of single crystal AlGaN based methods and devices. However, it is to be understood that benefits over the existing art are also obtained by use of the described devices and methods which employ polycrystalline AlGaN materials. Therefore, the following description is to be understood as appropriate for both single crystal and polycrystalline AlGaN materials.

In one embodiment, the present application employs a crystal AlGaN growth process which permits the AlGaN to be manufactured on a first or transfer substrate such as sapphire. After the AlGaN has been formed on the transfer substrate, a laser lift-off procedure is implemented to separate the transfer substrate from the AlGaN layer or region. This permits the AlGaN layer to be easily manipulated within the manufacturing process. In the laser lift-off process, radiation generated by an appropriate laser passes through the transfer substrate, which is transparent at the appropriate wavelength. The radiation is absorbed by a specific layer of the AlGaN material, leading to the decomposition of the material in this nitride absorption layer, permitting removal of the crystal AlGaN. A variety of patents have taught the concepts of a laser lift-off process which can be employed herein, including U.S. Pat. No. 6,895,645, issued May 24, 2005, entitled "Methods to Make Bimorph MEMS Devices," by Baomin Xu et al.; U.S. Pat. No. 6,757,314, issued Jun. 29, 2004, entitled "Structure for Nitride Based Laser Diode with Growth Substrate Removed," by Michael A. Kneissl et al.; and U.S. Pat. No. 6,627,921, issued Sep. 30, 2003, entitled "Structure and Method for Separation and Transfer of Semiconductor Thin Films Onto Dissimilar Substrate Materials," by-William S. Wong et al., the specifications of which are each fully incorporated herein by reference.

Figure 2:
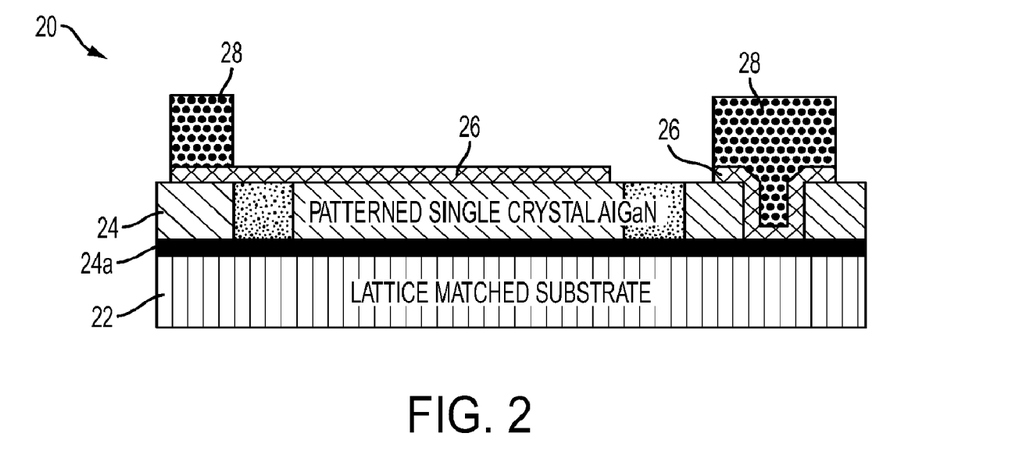
FIG. 2 illustrates a cross-section of a partially formed FBAR on a lattice-matched transfer substrate.

Turning to FIG. 2, illustrated is a cross-section of an FBAR 20 manufactured in accordance with the concepts of the laser lift-off process. Initially, transfer substrate 22 is provided, which may be a sapphire, aluminum oxide ($Al_2O_3$), or aluminum nitride (AlN) among others. An AlGaN layer 24 is deposited, as a single crystal (or alternatively a polycrystalline), on a surface of transfer substrate 22. The deposition and patterning of AlGaN layer 24 is achieved by use of any of a number of processes, including but not limited to chemical vapor deposition (CVD), and molecular beam epitaxy (MBE). The single crystal AlGaN layer 24 deposited on transfer substrate 22 is composed such that there is an appropriate lattice matching between transfer substrate 22 and AlGaN layer 24 to permit the laser liftoff process. The AlGaN layer 24 includes a laser absorption layer 24a, which may be composed of gallium nitride (GaN). In certain embodiments, Indium (In) may be used, for example by incorporation into layer 24, to improve growth of layer 24. Following depositing and patterning of the single crystal AlGaN layer 24, a first electrode structure 26 is then deposited and patterned on portions of AlGaN layer 24.

In manufacturing an FBAR it is desirable to have an air interface, therefore a further step provides for the connection of electrical contacts 28 on top of portions of electrode 26. Electrical contacts 28 act as a bonding pad for connection to a final substrate 30 (see FIG. 3), as well as providing the air gap desirable for FBAR operation.

Figure 3:
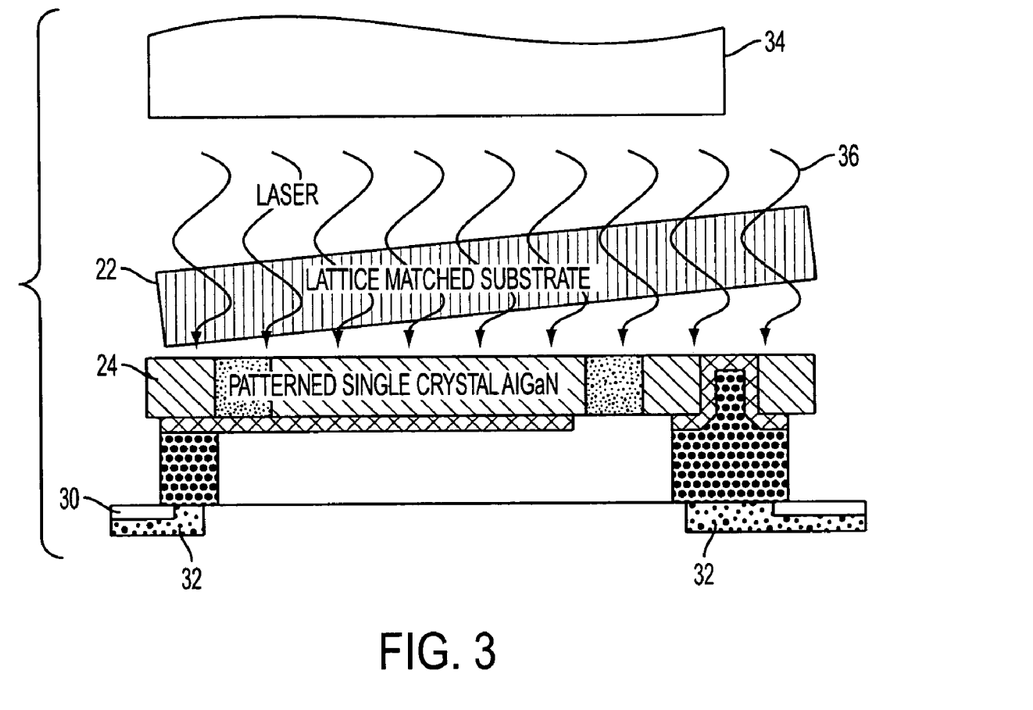
FIG. 3 is an FBAR which has been attached to a final substrate, wherein a laser lift-off process is being used to remove a transfer substrate.

In FIG. 3, the structure of FIG. 2 is shown turned over such that transfer substrate 22 is rotated to the top, and electrical contacts 28 are placed in contact with final substrate 30, such as the surface of an electronic chip or integrated circuit. Final substrate 30 is also shown to include wiring of conductor traces 32 to which electrical contacts 28 are connected. Laser 34 is positioned over lattice matched transfer substrate 22, to emit radiation beams 36 through transfer substrate 22, which is transparent at the frequency of laser 34. Radiation beams 36 thus pass through substrate 22 and are absorbed by laser absorption layer 24a (see FIG. 2). Absorption of beams 36 result in the breaking of the bond between transfer substrate 22 and patterned AlGaN layer 24. Once this bond is broken, the lattice matched 5. transfer substrate 22 is removed. It is to be appreciated additional steps may be undertaken in the removal process. For example, if the laser does not completely break the existing bond, a separate heater may be provided to apply additional energy at the interface between substrate 22 and AlGaN layer 24 to promote breaking of any remaining bonds.

Figure 4:
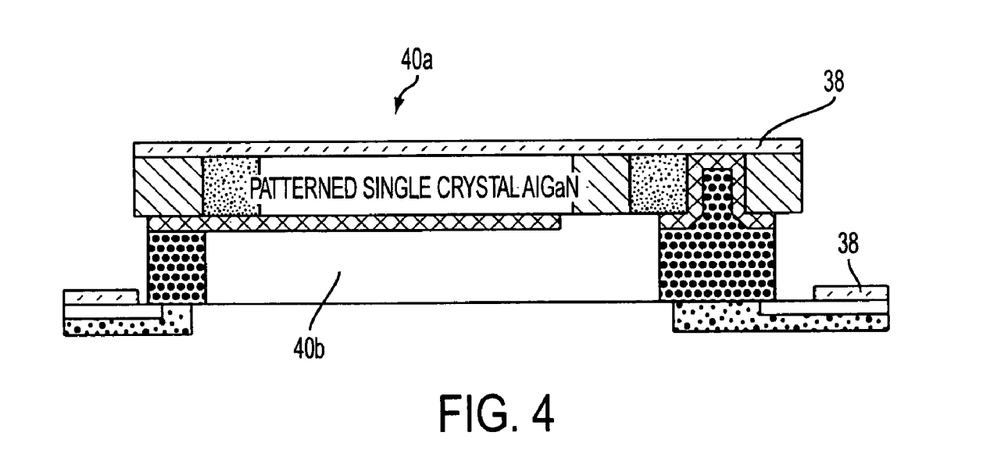
FIG. 4 illustrates the device manufacturing process of FIG. 3 after the lattice-matched substrate has been removed and an electrode metal layer deposited.

Turning to FIG. 4, following removal of lattice matched transfer substrate 22, a second electrode structure 38 is deposited and patterned onto a second surface of the AlGaN layer 24, and on final substrate 30 to permit for appropriate electrical connections. By this design, FBAR 20 of FIG. 4 is shown to have air interfaces 40a, 40b positioned at least at a portion on each side of patterned AlGaN layer 24.

It is to be appreciated AlGaN layer 24 may be formed as a single crystalline material. Use of a single crystalline piezoelectric 24 is understood by the inventors will increase the quality factor (Q) of the FBAR 20 at resonance, when compared to existing acoustic devices which use polycrystalline material. For example, using an FBAR employing an AlGaN single crystal is expected to increase the roll-off factor of the resonance at the edges of the resonator, decrease insertion losses and reduce temperature sensitivity. Particularly, compared to a polycrystalline device, an AlGaN single crystalline-based device would be understood to have less transfer losses than a polycrystalline device, since an AlGaN single crystalline layer results in less transmission losses as there are less boundaries to cross within the material.

Additionally, it is noted that the single crystal material is AlGaN. As opposed to existing FBARs which employ AlN, the AlGaN layer is a three-component material which permits for a more tailored FBAR by permitting for more precise lattice matching to a transfer substrate such as transfer substrate 22. Being able to select an AlGaN material, from a group of AlGaN materials having different values for the components (e.g., Al, Ga, N) of the three-component crystal (AlGaN), more precise lattice matching may be achieved to a variety of transfer substrates including but not limited to sapphire, $Al_2O_3$, Si, AlN and SiC. In other words, by providing the three-component structure, greater latitude and optimization to the lattice matching may be obtained, such as compared to devices employing AlN. Also, by using the three-component AlGaN material, the tailoring of the acoustic properties for the device for a particular application may also be achieved. For example, it is understood by the inventors that it would be possible to manufacture acoustic devices with split frequencies by having different thicknesses of the AlGaN.

A further benefit of the described FBAR manufacturing process is obtained through use of the laser lift-off process, whereby the patterned AlGaN layer 24 may be tuned to operate at a specific resonant frequency by performing a laser trimming operation to the surface of AlGaN layer 24. In particular, the same laser which is employed in the removal process, laser 34, may be used in the trimming process. Of course, this is not required, and another trimming device might be appropriate.

Also, while the preceding discussion describes a process for forming an FBAR 20 as shown in the foregoing figures, it is to be understood additional manufacturing steps may be undertaken. For example, damage to a surface of the AlGaN layer may occur during the laser liftoff process, particularly some scratching of the surface may occur. Therefore, there may be instances where it is desirable to smooth the removed AlGaN layer 24, and this may be accomplished by known polishing techniques such as dry polishing and/or wet polishing, among others.

Figure 5:
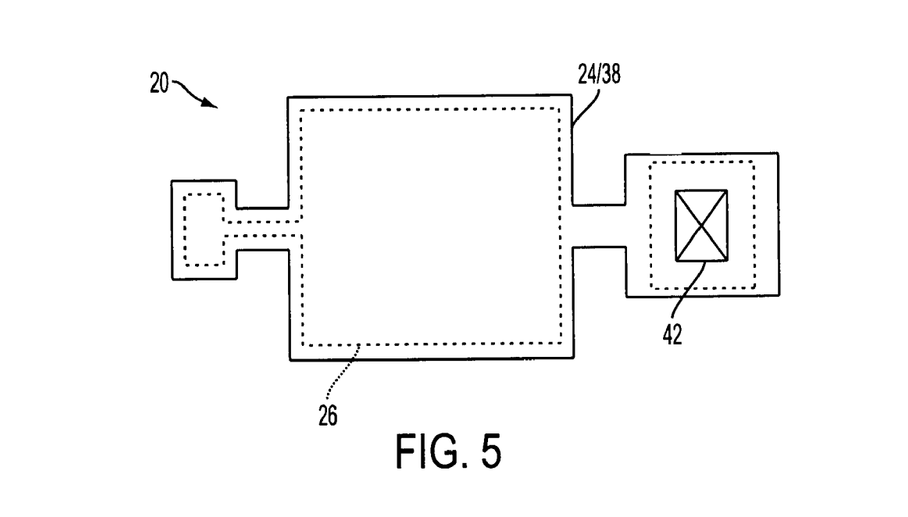
FIG. 5 shows a top view of the FBAR.

Turning to FIG. 5, shown is a top view of the FBAR 20 of FIG. 4. As can be seen, when placed on final substrate 30, a via 42 is provided between electrode structure 38 and final substrate 30. Electrode structure 26 is shown in dotted line, and the AlGaN 24 electrode 38 are illustrated by the solid-line layout.

Figure 6:
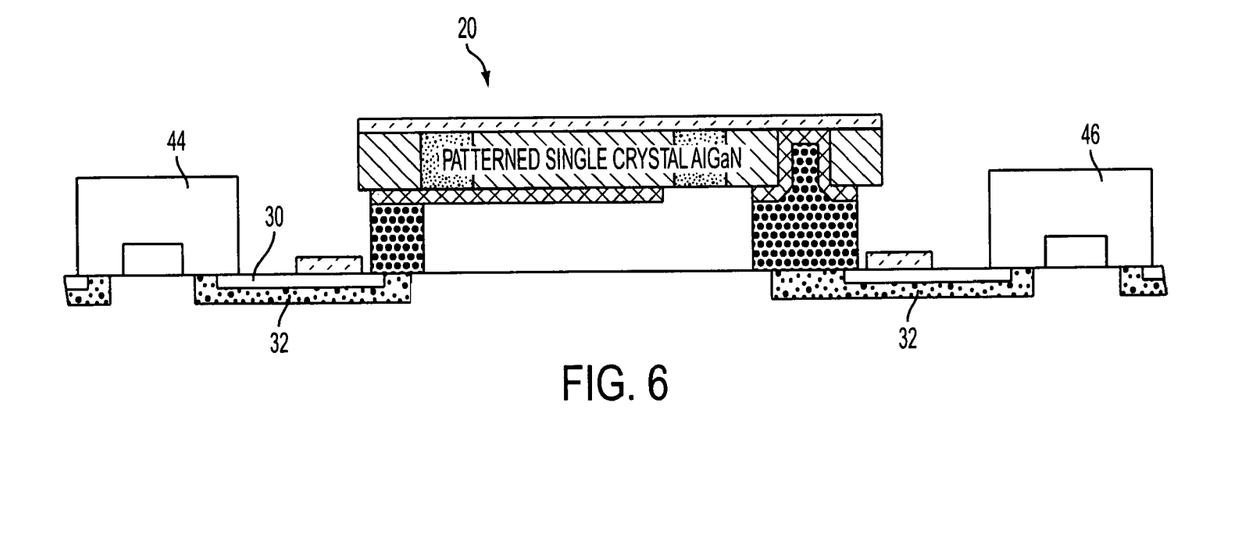
FIG. 6 illustrates the FBAR on a circuit with an electronic and opto-electronic device.

With attention to FIG. 6, illustrated is the FBAR 20 on final substrate 30, with electronic component 44 and an opto-electronic component 46. As illustrated, electronic device 44, and opto-electronic device are configured to be placed in electrical connection with Wiring 32, such as shown in FIGS. 3 and 4. The design of FIG. 6 is provided to emphasize that by use of the laser lift-off process, it is possible to attach a FBAR 20, formed with AlGaN layer 24 to an electronic chip or circuit board carrying other components. As is understood the deposition processes used to form the AlGaN layer requires temperature levels which would damage or destroy the electronic chip or circuit board. Therefore, by forming the AlGaN layer 24 on the transfer substrate (e.g., substrate 22), removing the substrate 22 and then forming the FBAR 20, connection of the FBAR 20 to the electronic chip or circuit board is achievable. Thus, again, FIG. 6 details connections of the electronic device 44, opto-electronic component 46 and FBAR 20 onto electronic chip/circuit board 30 to emphasize that use of the laser lift-off process makes it possible to integrate these varied components on a single board operational circuit.

Figure 7:
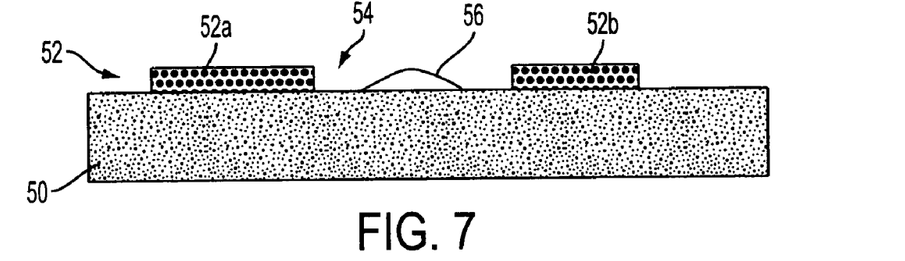
FIG. 7 illustrates a step in an epitaxial lateral overgrowth of a single crystal AlGaN on an r-plane sapphire.
Figure 8:
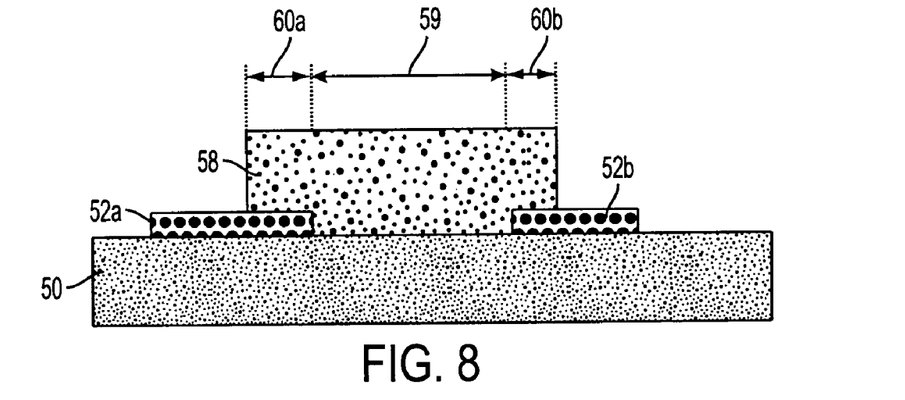
FIG. 8 illustrates partial growth of the single crystal AlGaN.
Figure 9:
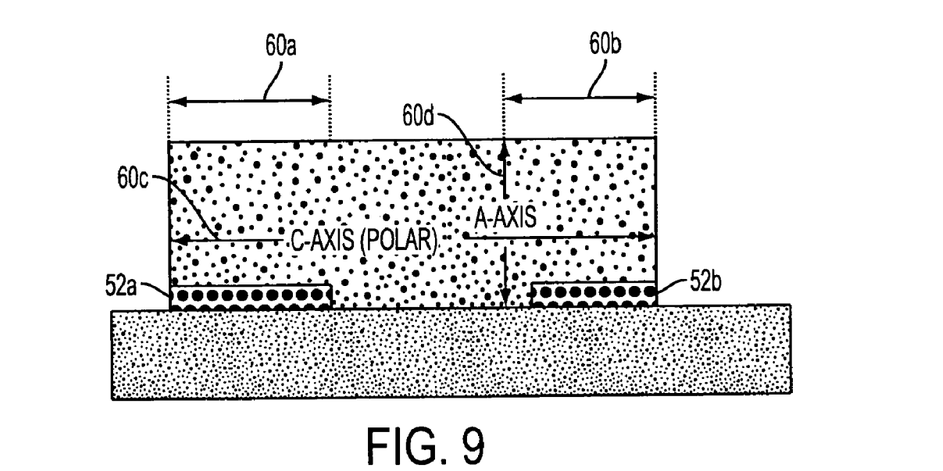
FIG. 9 depicts the single crystal AlGaN grown over patterned sacrificial layers.

Turning to FIGS. 7-9, attention is now directed to the generation of an FBAR by implementation of an epitaxial lateral overgrowth (ELOG) process. More particularly, this procedure involves depositing the piezoelectric material, such as AlGaN, on an r-plane sapphire or other appropriate substrate, and using the epitaxial lateral overgrowth (ELOG) process to fabricate the AlGaN layer or region, in such a manner that lateral devices are formed, for example, where the electrodes and the polar axis of the AlGaN layer are perpendicular to the plane of the substrate. The process also permits devices with different thicknesses to be developed, and therefore different resonant frequencies to be fabricated simultaneously, and to allow the possibility of fabricating electronic circuits on the same chip.

As shown in FIG. 7, a substrate 50, which again may be made of sapphire or other appropriate material, has a deposited and patterned sacrificial layer 52 located on a first surface. In this instance, layer 52 is patterned such that a void or window 54 exists between two portions 52a, 52b of sacrificial layer 52. Thereafter, a seed 56 is located within void 54, wherein seed 56 is selected to grow a piezoelectric layer, such as in the form of a single crystal AlGaN layer, although a polycrystalline AlGaN layer may also be grown. In one embodiment, a masking layer with holes presented therein (not shown) is located over seed 56. The AlGaN seed material will grow up through the holes in the mask layer, as is known in the art. In some cases the seed may be a distinct separate material, while in others it is simply the latticed matched material.

The growth pattern for the ELOG method is to have the AlGaN layer 58 to grow up and over sacrificial layer portions 52a-52b, such as shown in FIG. 8. Epitaxial lateral overgrowth is a lateral growth method used to reduce defect densities in crystalline materials. After the epitaxial growth exceeds the height of sacrificial layer portions 52a, 52b, the growth extends both vertically and laterally. While the area within the window may have a significant amount of defects 59, the lateral areas 60a, 60b, outside of window 54, grow essentially defect-free. As shown in FIG. 9, lateral growth areas 60a, 60b, which extend over sacrificial layer areas 52a, 52b, will be substantially defect-free. An aspect of ELOG is that the growth will occur in the c- or polar axis (i.e., lateral) 60c at a faster rate than in the a-axis (i.e., vertically) 60d. This growth technique is taken advantage of to produce laterally oriented single crystal AlGaN materials for use in FBARs.

Figure 10:
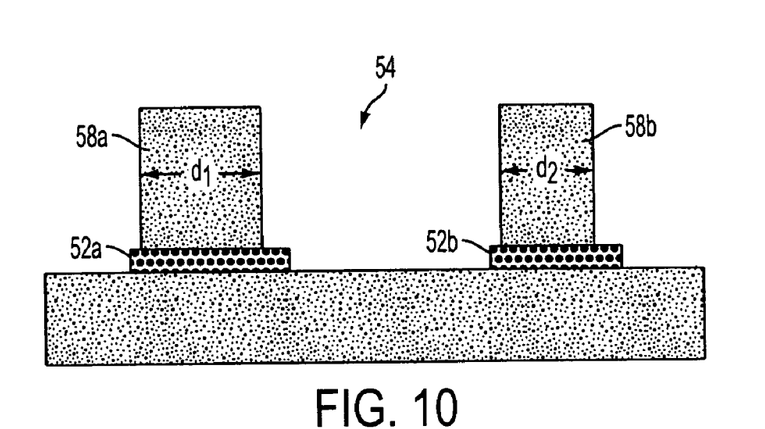
FIG. 10 illustrates an etching of the single crystal AlGaN.
Figure 11:
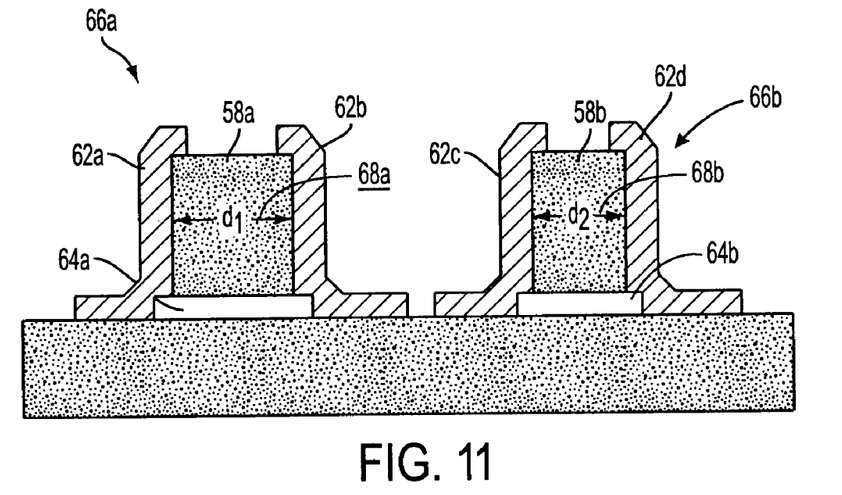
FIG. 11 illustrates lateral FBARs with different thicknesses in the c-axis direction after patterning and etching of the AlGaN regions with attached electrodes and with the sacrificial regions removed.

Once grown to an appropriate size, piezoelectric material 56 is etched and patterned, for example, as shown in FIG. 10. More particularly, the piezoelectric material 56 which correspond to window 54 are removed, whereby piezoelectric material 58 is etched into separate distinct areas 58a and 58b, where the remaining piezoelectric material is located over at least some of the sacrificial layer portions 52a, 52b. In a next step, as depicted in FIG. 11, electrodes 62a and 62b and 62c and 62d, are deposited onto the individual piezoelectric material areas 58a and 58b, respectively. Thereafter, sacrificial layer portions 52a, 52b are removed by known etching processes, leaving open areas 64a, 64b, such that portions of both an upper surface and a bottom surface of piezoelectric areas 58a and 58b face opposite a void e.g., an air or vacuum interface). This results in freestanding FBAR structures 66a and 66b.

As may be noticed in FIG. 11, individual FBAR structures 66a and 66b have different thicknesses 68a and 68b. Such differences are determined by the mask design (photolithography) and-not by control of the manufacturing process. For example, the length of the sacrificial substrate portions 52a, 52b may be chosen to be different from each other, and then during the etching in FIG. 10, the individual piezoelectric areas 58a, 58b are configured to have different thicknesses which preferably correspond to sacrificial substrate portions 52a, 52b.

By the described manufacturing process, FBARs 66a, 66b will have different resonant frequencies. Thus, the described process permits for multiple FBARs of different resonant frequencies to be formed on a same substrate simultaneously within the same fabrication process. In systems where multiple FBARs are desirable, such as in multi-channel cell phones or other handheld devices, multiple resonant FBARs can now be provided on a single chip. It is to be appreciated that while the present design shows two FBARs produced on a single substrate, multiple FBARs may be formed by repeating the described process. Additionally, if a single free-standing lateral FBAR is desired, the substrate may be cut, thereby providing for the individual FBARs.

Alternatively, the process of FIGS. 7-9 may be implemented to form a single device. In this situation a single sacrificial layer 52 is patterned, and the overgrowth process (ELOG) is used to form a single AlGaN region. Which, by use of the previously described operations, can be processed to form an acoustic device, such as an FBAR.

Figure 12:
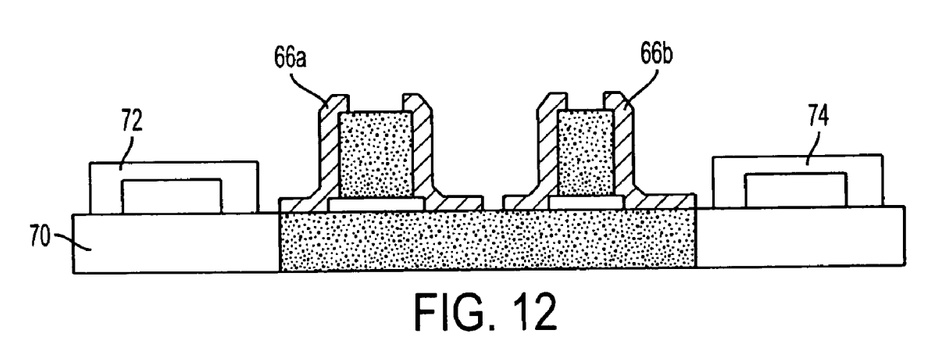
FIG. 12 depicts the lateral FBARs on a circuit board with other electronic and/or opto-electronic devices.

Turning to FIG. 12, illustrated are lateral FBARs 66a and 66b integrated on an electronics chip or circuit board 70, with other components. For example, component 72 may be an electronic circuit for driving FBARs 66a, 66b, as well as other electronic circuitry. Component 74 may be an electro-optical component and/or a microwave based device, among others. In either of the foregoing situations, components 72 and 74 are attached to the substrate which is also carrying the FBARs 66a and 66b. As the described process does not require removal of the lattice matched substrate, integration of the FBAR devices with electronic circuits patterned elsewhere on the chip is a feasible implementation of the present concepts.

As previously mentioned, while the foregoing has discussed the generation of FBARs as the main examples, it is to be understood the acoustic structures developed by the foregoing processes may be implemented in other environments. For example, Stacked Thin Film Bulk Acoustic Resonators (SBARs) may be manufactured according to the described concepts, as well as devices that operate at other acoustic frequencies, such as in a sheer wave mode, among others.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A method of forming an acoustical device comprising:
providing a first substrate having a first surface and a second surface where the substrate is one of an r-plane sapphire, aluminum oxide ($Al_2O_3$) or aluminum nitride (AlN);
growing a single crystal piezoelectric region having a first surface and a second surface, the single crystal piezoelectric region located on the first surface of the first substrate, wherein the first surface of the single crystal piezoelectric region and the first surface of the substrate are in direct contact;
depositing a first electrode layer on a second surface of the single crystal piezoelectric region;
performing a laser lift-off process including employing a radiation source to break a bond between the first surface of the first substrate and the first surface of the single crystal piezoelectric region to separate the first substrate and the single crystal piezoelectric region;
performing a laser trimming process with the radiation source;
smoothing the surface of the first surface of the single crystal piezoelectric region through polishing techniques in order to tune the first surface of the single crystal piezoelectric region to operate at a specific resonant frequency; and
depositing a second electrode layer on the first surface of the single crystal piezoelectric region.

2. The method according to claim 1, wherein the lift-off process includes,
emitting, from the radiation source, a radiation beam through the first substrate to an attachment interface formed by the first substrate and the single crystal, wherein the first substrate is substantially transparent at the wavelength of the radiation beam, and the radiation beam generates sufficient absorbed energy at the interface to break the attachment.

3. The method according to claim 2, wherein the trimming process includes trimming the single crystal piezoelectric region to cause the single crystal piezoelectric region to resonate at a desired frequency.

4. The method according to claim 2, wherein following the step of depositing the first electrode, providing a gap forming arrangement on the same side as the first electrode.

5. The method according to claim 4, wherein prior to performing the liftoff process, bonding the gap forming arrangement to a second substrate.

6. The method according to claim 1, wherein the acoustical device is operational in at least one of a bulk resonant mode and a shear wave resonant mode.

7. An acoustical device that is operational in at least one of a bulk resonant mode and a shear wave resonant mode, comprising:
an AlGaN region having a first surface and a second surface;
a first electrode deposited on the first surface of the AlGaN region;
a second electrode deposited on the second surface of the AlGaN region;
a first air or vacuum interface adjacent to at least a portion of the first surface of the AlGaN region and the first electrode; and
a second air or vacuum interface associated with at least a portion of the second surface of the AlGaN region and the second electrode, wherein the AlGaN region is a polycrystalline AlGaN region.

8. An acoustical device that is operational in at least one of a bulk resonant mode and a shear wave resonant mode, comprising:
an AlGaN region having a first surface and a second surface;
a first electrode deposited on the first surface of the AlGaN region;
a second electrode deposited on the second surface of the AlGaN region;
a first air or vacuum interface adjacent to at least a portion of the first surface of the AlGaN region and the first electrode; and
a second air or vacuum interface associated with at least a portion of the second surface of the AlGaN region and the second electrode, wherein the AlGaN region is selected from a variety of AlGaN material types, having different values, from each other, of at least one of the Al and Ga components, and wherein In is used during growth and incorporated in the AlGaN region.

* * * * *